United States Patent
Yamada et al.

(10) Patent No.: US 6,946,161 B2
(45) Date of Patent: Sep. 20, 2005

(54) METHOD FOR FORMING POROUS SILICA FILM

(75) Inventors: Kazuhiro Yamada, Kanagawa (JP); Nobutoshi Fujii, Kanagawa (JP)

(73) Assignee: Ulvac, Inc., Kanagawa (JP)

( * ) Notice: Subject to any disclaimer, the term of this patent is extended or adjusted under 35 U.S.C. 154(b) by 17 days.

(21) Appl. No.: 10/645,581

(22) Filed: Aug. 22, 2003

(65) Prior Publication Data

US 2004/0058079 A1 Mar. 25, 2004

(30) Foreign Application Priority Data

Aug. 27, 2002 (JP) ........................ 2002-247190
Feb. 10, 2003 (JP) ........................ 2003-032189

(51) Int. Cl.$^7$ ................................ B05D 3/02
(52) U.S. Cl. ................ 427/226; 427/245; 427/384
(58) Field of Search ................ 427/243, 244, 427/245, 247, 226, 229, 384

(56) References Cited

U.S. PATENT DOCUMENTS 6,365,266 B1 * 4/2002 MacDougall et al. .... 428/304.4
6,592,980 B1 * 7/2003 MacDougall et al. .... 428/304.4

FOREIGN PATENT DOCUMENTS

| EP | 1123753 | * | 8/2001 |
| JP | 2001-118841 | * | 4/2001 |
| JP | 2002-173641 | * | 6/2002 |
| JP | 2003-089768 | * | 3/2003 |
| JP | 2003-089769 | * | 3/2003 |
| JP | 2003-163210 | * | 6/2003 |

OTHER PUBLICATIONS

Gomez–Vega et al, International Conference on Processing Materials for Properties, Proceedings, 2$^{nd}$, San Francisco, CA, Nov. 2000, pp 257–262.*

* cited by examiner

Primary Examiner—Erma Cameron
(74) Attorney, Agent, or Firm—Arent Fox, PLLC

(57) ABSTRACT

A method for forming a porous silica film having mechanical strength utilizeses a surfactant, one or more kinds of nonionic surfactant(s) having a 0.1 weight % concentration according to the Du Nouy method expression and a surface tension of 45 mN/m or larger at 25° C. is (are) used as a surfactant, a mixed solution obtained by mixing this nonionic surfactant, a hydrolyzable alkoxysilane compound, water and an alcohol is coated on the substrate, and the surfactant in this mixed solution is decomposed or burned out to form a porous silica film. The surfactant is suitably represented by formula $OH(CH_2CH_2O)x(CH(CH_3)CH_2O)y(CH_2CH_2O)xH$ where x and y denote an integer satisfying $1 \leq x \leq 185$ and $5 \leq y \leq 70$, respectively. Alternatively, a mixed solution in which a dimethyldialkoxysilane is added may be used.

6 Claims, 4 Drawing Sheets

(a)

(b)

(a)

(b)

(a)

(b)

(a)

(b)

METHOD FOR FORMING POROUS SILICA FILM

BACKGROUND OF THE INVENTION

1. Field of the Invention

The present invention relates to a method for forming a porous silica film. Porous silica film is useful as a semiconductor insulating film due to the excellent property of low relative dielectric constant (low-k), or as a low refractive index optical film in the display field due to the excellent property of low refractive index (low-N).

2. Description of the Related Art

A porous silica film obtained by thermal-treating solution of a mixture of a hydrolyzable alkoxysilane compound, a water-alcohol type solvent and a pore forming material on a substrate is promising as a semiconductor material for an interlayer insulating film of copper wiring of LSI etc., or a display material which can bring highly efficient takeout of internal light emitting upon lamination on a transparent electrically conducting film. Further, porous silica film can be applied to novel utility such as anti-reflection to incident light from the outside in a solar cell.

Such attention to porous silica film is paid due to the property of low specific dielectric constant value below 2.5 and the low refractive index property in addition to simplicity of a wet process through a sol-gel method (see, for example, Non-Patent References 1 and 2).

However, on the other hand, some concerns are caused by deficiency in the mechanical strength because of the porous structure. For example, in a semiconductor process, when chemical mechanical polishing (CMP) is performed for forming a copper dual damascene wiring structure, or when high speed wire bonding is performed with a bonding apparatus, porous film is destructed due to deficiency in the structural strength in some cases. Such a deficiency in the strength and the possibility of deterioration in the insulating performance due to adsorption of a moisture into a pore are the reasons why porous film is prevented from being in use. In addition, also in the display field, for the improvement against deficiency in the strength of a porous film, a reinforcing layer for reinforcing the strength is inserted as an intermediate layer to a laminated structure in some cases. Since such improvement is contrary to demand for simplification in a multi-layered structure, deficiency in the strength of porous silica film, as well as developing for reduction of film thickness and surface flattening become an important problem.

[Non-Patent Reference 1]

H. Hanahata, S. Matsuno, M. Miyamoto, T. Ioka and T. Tanabe, "Proc. Advanced Metallization Conf.", 2000, p. 103

[Non-Patent Reference 2]

K. Suzuki, Y. Nakata, I. Sugiura, T. Owada, S. Fukuyama and E. Yano, "Proc. Advanced Metallization Conf.", 2001, p. 4

In view of the aforementioned problems, an object of the present invention is to provide a method for forming a porous silica film having such a mechanical strength that overcomes the deficiency in the strength which has ever been pointed out. The strength sought in this case is presumed to be consistent with a practical level, for example, in the semiconductor field and the display field.

SUMMARY OF THE INVENTION

In order to attain the aforementioned object, in a method for forming a porous silica film of the present invention, a hydrolyzable alkoxysilane compound, water, an alcohol and a surfactant are used and, upon this, at least one kind of nonionic surfactant having a concentration of 0.1 weight % expressed according to the Du Nouy method and a surface tension of 45 mN/m or larger at 25° C. is used as the surfactant, and a mixed solution obtained by mixing this nonionic surfactant, an alkoxysilane compound and a water-alcohol type solvent is coated on a substrate, and the surfactant in this mixed solution is decomposed or burned out.

Since a porous silica film which is formed by calcination for decomposing or burning out the aforementioned surfactant after wet treatment such as a sol-gel method produces many pores through a template of a liquid crystal of a surfactant having the high surface tension, the pore strength becomes improved. And, since such many pores are formed, the strength of the whole film becomes improved, and the formed porous silica film can have a sufficient mechanical strength. The aforementioned Du Nouy method is classified into a static measuring method by a ring method among various surface tension measuring methods.

In this case, a suitable example of the nonionic surfactant is a polyoxyethylene-polyoxypropylene condensate represented by the formula $OH(CH_2CH_2O)x(CH(CH_3)CH_2O)y(CH_2CH_2O)xH$ [Chemical formula 1]. Such a condensate is of a straight chain structure having a long skeleton, and forms liquid crystals in various forms at a certain concentration higher than the critical micelle concentration. Pores in a porous silica film obtained through a template of this liquid crystal are formed in a structure which is extremely long in a longitudinal direction. In addition, since a thickness of a silica wall present between pores becomes uniform, when a stress is applied, a high strength structure is obtained without stress concentration.

A suitable example of the aforementioned mixed solution is such that 8 to 50 mole of water and 0.1 to 0.5 mole of a polyoxyethylene-polyoxypropylene condensate represented by the above [Chemical formula 1] are mixed against 1 mole of the alkoxysilane compound.

In addition, more preferably, a mixture in which 0.05 to 0.5 mole of a dimethyldialkoxysilane compound represented by $Si(CH_3)_2(OR)_2$ [Chemical formula 2] is added to the aforementioned mixed solution, that is, the mixture in which 8 to 50 mole of water and 0.1 to 0.5 mole of polyoxyethylene-polyoxyprpoylene condensate ([Chemical formula 1]), and 0.05 to 0.5 mole of a dimethyldialkoxysilane compound ([Chemical formula 2]) are mixed against 1 mole of the alkoxysilane compound can be used.

Although a porous silica film formed by using the aforementioned mixed solution becomes a worm-holes pore structure by decomposition or burning out of surfactant in this mixed solution, which is observed by a sectional transmission electron microscope (TEM), the film has considerable strength which is not inferior to that of a porous film having a periodic structure such as a hexagonal one.

DETAILED DESCRIPTION OF THE PREFERRED EMBODIMENTS

Figure 1:
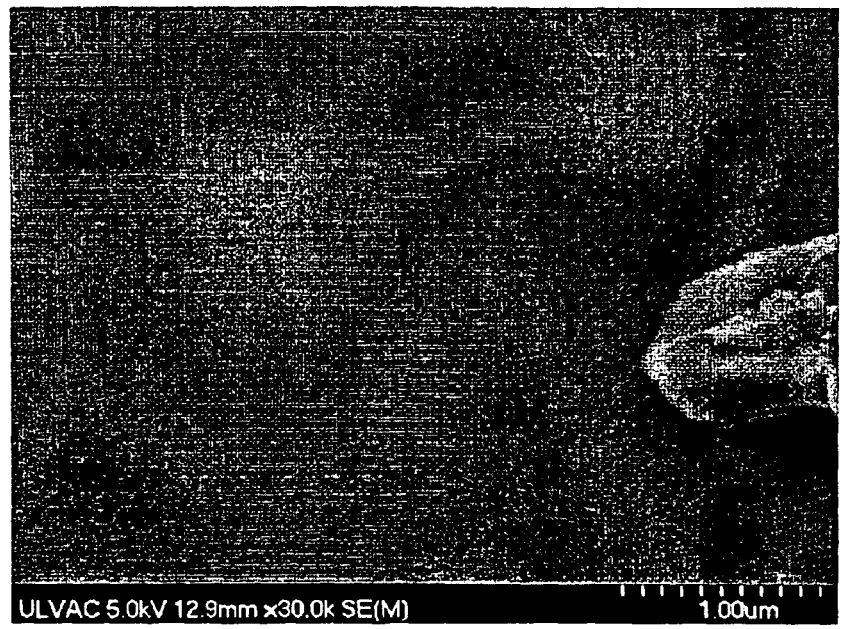
FIGS. 1(*a*) and (*b*) is a SEM photograph of a porous silica film formed in [Example 1]
Figure 1:
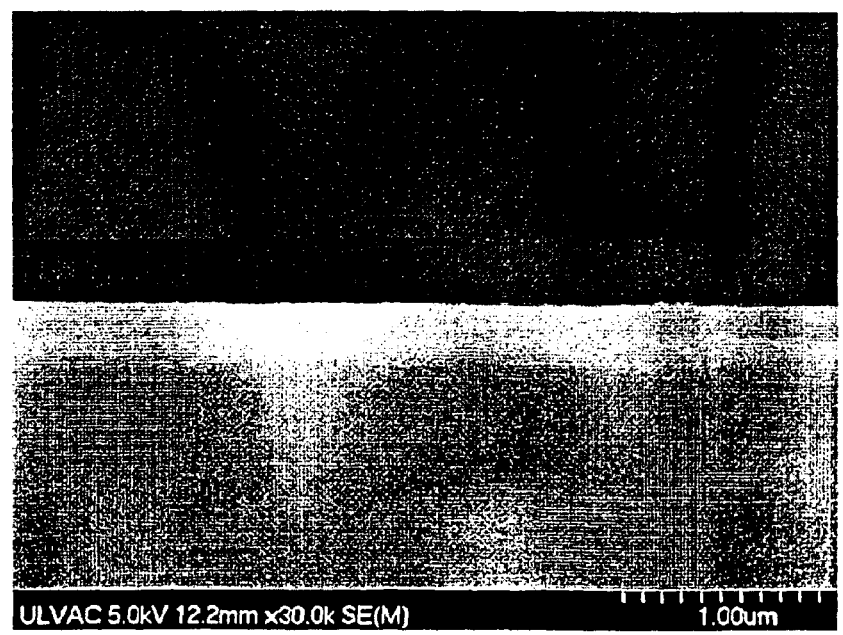

A method for forming a porous silica material of the present invention comprises heat-treating of a solution obtained through acid hydrolysis or alkali hydrolysis of an alkoxysilane compound solution, a precursor of a porous silica material, evaporation of a solvent, water, and an acidic or alkaline catalyst in this precursor solution and, thereafter, decomposition and removal of a surfactant to obtain a porous silica material.

In addition, when a precursor solution of the porous silica material is coated on a substrate by spin-coating and the like to form a material before the aforementioned heat treating, such a forming method involving the coating becomes a part of a step of making a porous silica film on a substrate.

As a precursor of a porous silica material, silicon alkoxide such as tetraethoxysilane (hereinafter, also referred to as TEOS) is used. Catalysts of hydrolysis may involve acidic one or alkaline one. With respect to examples of the catalysts, in the case of acid hydrolysis, inorganic acids such as nitric acid and hydrochloric acid may be used, and organic acids such as formic acid may be used. In the case of alkali hydrolysis, ammonia and the like can be used.

It is preferable to use nonionic surfactants such as a polyoxyethylene-polyoxypropylene condensate represented by the above [Chemical formula 1] as a surfactant. As this surfactant is decomposed, a lot of pores are generated in the resulting silica material and, in case that a film is made on a substrate as described above, then the porous thin film structure is formed.

And, it was observed and confirmed by a sectional transmission electron microscope that a thin film structure is formed into a worm-hole porous structure by decomposition or burning out this surfactant. Nevertheless, it was found that this thin film structure has strength which is not inferior to that of a porous film having a periodic structure such as a hexagonal one.

As amounts of materials to be used in the precursor solution, it is desirable to add 8 to 50 mole of water and 0.1 to 0.5 mole of the polyoxyethylene-polyoxypropylene condensate against 1 mole of an alkoxysilane compound as a precursor. A further suitable example is that 0.05 to 0.5 mole of the dimethyldialkoxysilane compound represented by the [Chemical formula 2] is added to that mixed solution, that is, 8 to 50 mole of water, 0.1 to 0.5 mole of a polyoxyethylene-polyoxypropylene condensate ([Chemical formula 1]), and 0.05 to 0.5 mole of a dimethyldialkoxysilane compound ([Chemical formula 2]) are mixed against 1 mole of an alkoxysilane compound.

As described above, a precursor solution of a porous silica material is coated on a semiconductor substrate through a typical coating method such as a spin-coating one, then, is heat-treated using a known infrared heating furnace, and a water-alcohol type solvent, an acid or ammonia, and a surfactant, and other materials are evaporated to form a porous silica film. The heating treatment conditions in this case are not particularly limited as far as the conditions can make the solvent, the acid and the ammonia evaporated to obtain the porous film, consequently.

In order to obtain a porous film having a low relative dielectric constant, preferably, mainly a solvent is evaporated through the treatment at a temperature of around 50 to 350° C. in air, then followed by heat treatment at such a temperature that a surfactant and other organic materials can be evaporated (e.g. 250 to 500° C.) for such a period that the structure of the resulting porous film will not be destructed.

This obtained porous silica film exhibits a remarkably low relative dielectric constant property and low refractive index property, and high strength, and an interlayer insulating film having a sufficiently practical mechanical strength in the semiconductor process and the display field can be obtained.

In addition, in the present invention, as a precursor of a porous silica material, an alkoxysilane compound such as TEOS is preferably used. By using this, for example, an interlayer insulating film of a low relative dielectric constant having a porosity of 60% or higher can be prepared by the coordination of kinds and amounts of surfactant to be added. As porosity grows higher, for example, when porosity reaches around 80%, contribution of the physical property caused by materials constituting an insulating film against a specific dielectric constant becomes smaller, and since the contribution by air becomes dominant, an interlayer insulating film having a very low relative dielectric constant can be obtained. In addition, even when a hydrolyzable alkoxide is used instead of an alkoxysilane compound, a similar porous film can be prepared as in the case of alkoxysilane compound. As such an alkoxide, for example, alkoxides derived from titanium and zirconium belonging to the materials in Periodic Table Group 4A can be used as $Ti(OC_3H_7)_4$ and $Zr(OC_4H_9)_4$.

EXAMPLES

Examples of the present invention will be explained below by referring to the drawings.

Example 1

1 Mole of TEOS, 11 mole of $H_2O$, and L31 of an average molecular weight of 944 represented by [Chemical formula 3] as a nonionic surfactant were uniformly stirred at room temperature under a strong acidic environment in ethanol, to prepare a transparent mixed solution.

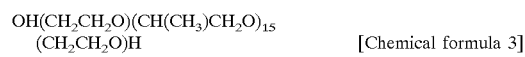
$OH(CH_2CH_2O)(CH(CH_3)CH_2O)_{15}$
$(CH_2CH_2O)H$ [Chemical formula 3]

Upon this, the surface tension of the L31 measured according to the Du Nouy method was 46.9 mN/m (0.1 weight % concentration and 25° C.). Here, four kinds of solutions in which the L31 was added to 1 mole of TEOS each at 0.25, 0.31, 0.45 and 0.73 mole, respectively, were prepared, and used as coating solutions.

After each coating solution was spin-coated on a semiconductor silicon substrate at 2500 rpm, the substrate was calcined at first at 130° C. for 1 hour under atmospheric atmosphere, then at 400° C. for 1 hour in air, using a known infrared heating furnace. The conditions necessary for these treatments, that is, temperature condition, temperature raising time and retention time are not particularly limited, but may be in such a conditional range that quality performance of the film of the resulting porous silica film is not deteriorated. In addition, finally, a mixed vapor containing hexamethyldisilazane (hereinafter, also referred to as HMDS) in $N_2$ was introduced into the known infrared heating furnace at 1 kPa, and heat treatment was performed at 400° C. for 30 minutes to make a porous silica film hydrophobic.

Regarding the obtained porous silica film from each coating solution, a relative dielectric constant according to a mercury probe method at 1 MHz and an elastic modulus and a hardness according to a nanoindentation method were measured, and the results shown in the following [Table 1] were obtained.

TABLE 1

| L31/TEOS molar ratio | Relative dielectric constant | Elastic modulus (GPa) | Hardness (GPa) |
|---|---|---|---|
| 0.25 | 2.6 | 9.2 | 0.89 |
| 0.31 | 2.4 | 6.2 | 0.64 |
| 0.45 | 2.2 | 4.7 | 0.49 |
| 0.73 | 2.0 | 5.7 | 0.41 |

As apparent from [Table 1], it can be seen that as the amount of L31 becomes larger, the relative dielectric constant of the formed porous silica film becomes lower. On the other hand, when the amount of L31 becomes large, since the surface tension and viscosity of the solution are increased, it becomes difficult to coat on a substrate, in particular, it becomes difficult to coat uniformly and form a porous silica film on a substrate having a great area such as an 8 to 12 inch size wafer and the like.

In addition, examples (L31/TEOS=0.73) of scanning electron microscope (SEM) photographs of the porous silica film obtained in [Example 1] are shown in FIGS. 1(a) and (b).

From the photographs of FIG. 1, it can be seen that although a porosity of the porous silica film is presumed to be 40% or higher from a measured value of a relative dielectric constant, no pore is observed from the SEM photographs, and fine pores of a few nm order are formed.

Comparative Examples 1 to 3

When the previous porous silica films (LKD5109 manufactured by JSR Corporation, ALCAP-S 5100 manufactured by Asahi Kasei Corporation and Porous silica manufactured by Fujitsu Limited) and [Example 1] at a molar ratio of 0.73 of L31 were compared, the results shown in the following [Table 2] were obtained. A value of a refractive index at a wavelength of 633 nm at spectroscopic ellipsometry was used for measuring a refractive index in [Example 1], and the values published in the literatures are used in [Comparative Example 1], except for an elastic modulus and a hardness, which are obtained from the measured values.

TABLE 2

| | Kinds of porous film | Relative dielectric constant | Refractive index | Elastic modulus (GPa) | Hardness (GPa) |
|---|---|---|---|---|---|
| [Example 1] | (L31/TEOS = 0.73) | 2.0 | 1.21 | 5.7 | 0.41 |
| [Comparative Example 1] | LKD5109 | 2.2 | 1.25 | 3.2 | 0.45 |
| [Comparative Example 2] | ALCAP5100 | 2.2 | 1.27 | 3.3 | — |
| [Comparative Example 3] | Porous silica | 2.20–2.25 | 1.275 | 5.5–6.0 | 0–0.7 |

From [Table 2], it can be seen that although the porous silica film formed by the present invention has a lower relative dielectric constant and lower refractive index than those of the prior art, the film has a high elastic modulus and, at the same time, a considerable hardness.

Example 2

0.85 Mole of TEOS, 11 mole of $H_2O$, 0.15 mole of dimethyldimethoxysilane (hereinafter, also referred to as DMDMOS) and 0.017 mole of P103 of an average molecular weight of 4643 represented by formula [Chemical formula 4] as a nonionic surfactant were uniformly stirred at room temperature under a strong acidic environment in ethanol, to prepare a transparent mixed solution.

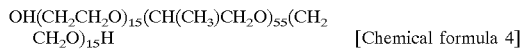

$OH(CH_2CH_2O)_{15}(CH(CH_3)CH_2O)_{55}(CH_2CH_2O)_{15}H$ [Chemical formula 4]

Thereafter, 0.11 mole of L31 represented by [Chemical formula 3] was mixed with this mixed solution to prepare a uniform mixed solution. Upon this, the surface tension of the P103 according to the Du Nouy method was 34.4 mN/m (0.1 weight % concentration and 25° C.).

Using this mixed solution as a coating solution, a porous silica film was formed under the same conditions as those of [Example 1], a relative dielectric constant, an elastic modulus and a hardness were measured, respectively, and the results shown in the following [Table 3] were obtained.

Comparative Example 5

According to the same manner as that of [Example 2] except that 0.053 mole of P103 represented by [Chemical formula 4] was further used in place of L31 represented by [Chemical formula 3], a coating solution was prepared. From this, a porous silica film was formed, a relative dielectric constant, an elastic modulus and a hardness were measured, respectively, and the results shown in following [Table 3] were obtained.

TABLE 3

| | Kinds of surfactant | Relative dielectric constant | Elastic modulus (GPa) | Hardness (GPa) |
|---|---|---|---|---|
| [Example 2] | P103 + L31 | 1.85 | 4.2 | 0.35 |
| [Comparative Example 5] | Only P103 | 1.83 | 1.5 | 0.16 |

From [Table 3], it can be seen that the porous silica film formed by adding L31 improved mechanical strength twice as much as a film formed of only P103, while exhibiting an equivalent relative dielectric constant.

In addition, a scanning electron microscope (SEM) photograph of the porous silica film obtained by [Example 2] is shown in FIGS. 2(a) and (b).

Figure 2:
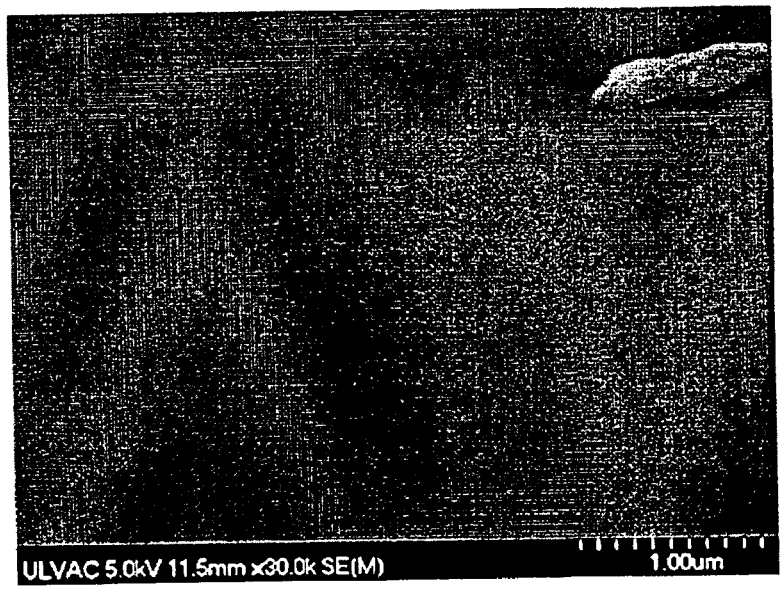
FIGS. 2(*a*) and (*b*) is a SEM photograph of a porous silica film formed in [Example 2]
Figure 2:
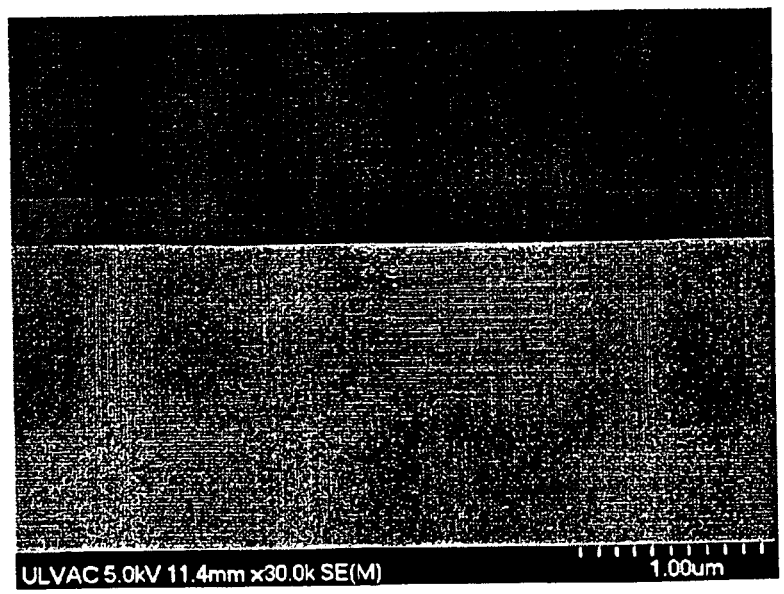

From the photograph of FIG. 2, it can be seen that the porous silica film obtained by [Example 2] has superior smoothness over that of [Example 1]. In addition, it can be seen that no pore is observed as in [Example 1], and fine pores of a few nm order in scale are formed.

Example 3

0.85 mole of TEOS, 11 mole of $H_2O$, 0.15 mole of dimethyldiethoxysilane (hereinafter, also referred to as DMDEOS) and 0.12 mole of P45 of an average molecular weight of 2300 represented by [Chemical formula 5] as a nonionic surfactant were uniformly stirred at room temperature under a strong acidic environment in ethanol, to prepare a transparent mixed solution.

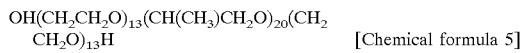

$OH(CH_2CH_2O)_{13}(CH(CH_3)CH_2O)_{20}(CH_2CH_2O)_{13}H$ [Chemical formula 5]

Upon this, the surface tension of the P45 according to the Du Nouy method was 46.3 mN/m (0.1 weight % concentration and 25° C.).

After this mixed solution as a coating solution was spin-coated on a semiconductor silicon substrate at 1200 rpm, the substrate was calcined at 400° C. for 1 hour in the air using the known infrared heating furnace. A time for raising a temperature to 400° C. was 15 minutes. The conditions necessary for these treatments, that is, temperature raising time and retention time are not particularly limited, but may be in such a conditional range that the film performance of the obtained porous silica film is not deteriorated. In addition, finally, a mixed vapor containing HMDS in $N_2$ was introduced into the known infrared heating furnace at a pressure of 1 kPa, followed by heat treatment at 400° C. for 1 hour to make the porous silica film hydrophobic.

Regarding the obtained porous silica film, a relative dielectric constant, a refractive index, an elastic modulus and a hardness were measured, respectively, under the same conditions as those of [Table 2] in [Example 1], and the results shown in the following [Table 4] were obtained.

In addition, it was found that, when DMDEOS is not added to the aforementioned coating solution, the resulting porous silica film becomes a pore structure of a two-dimensional hexagonal close-packed structure (hexagonal sequence), and a relative dielectric constant is raised.

Comparative Examples 6 to 8

Respective properties of the previous porous silica films (LKD 5109 manufactured by JSR Corporation, ALCAP-S 5100 manufactured by Asahi Kasei Corporation and Porous silica manufactured by Fujitsu Limited) are shown in the following [Table 4]. The values published in the literatures are used in [Comparative Example 6], except for an elastic modulus and a hardness, which are obtained from the measured values.

TABLE 4

| | Kind of porous film | Relative dielectric constant | Refractive index | Elastic modulus (GPa) | Hardness (GPa) |
|---|---|---|---|---|---|
| [Example 3] | (P45/TEOS = 0.12) | 2.2 | 1.218 | 5.0 | 0.50 |
| [Comparative Example 6] | LKD5109 | 2.2 | 1.250 | 3.2 | 0.45 |
| [Comparative Example 7] | ALCAP5100 | 2.2 | 1.270 | 3.3 | — |
| [Comparative Example 8] | Porous silica | 2.20–2.25 | 1.275 | 5.5–6.0 | 0–0.7 |

From [Table 4], it can be seen that although the porous silica film formed by the present invention exhibits an equivalent relative dielectric constant to that of the prior art, the film attains a low refractive index, a high elastic modulus and a high hardness.

In addition, regarding the porous silica film obtained by [Example 3], scanning electron microscope (SEM) photographs of a surface and a cross-section are shown in FIGS. 3(a) and (b).

Figure 3:
FIGS. 3(*a*) and (*b*) is a SEM photograph of a porous silica film formed in [Example 3]
Figure 3:
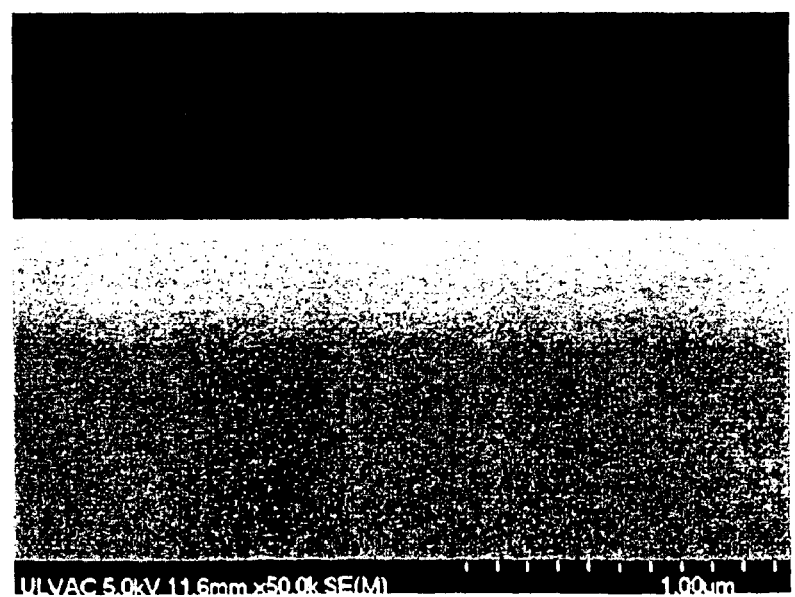

From the photograph of FIG. 3, it can be seen that, in the porous silica film obtained by [Example 3], no pore is observed as in [Example 1] and [Example 2], and so fine pores of a few nm order in scale are formed as to be undetectable by SEM observation.

Then, regarding the porous silica film obtained by [Example 3], transmission electron microscope (TEM) photographs of a surface and a cross-section are shown in FIGS. 4(a) and (b). Here, by using a staining method of filling $RuO_4$ into pores in a film in an observation sample, pores are shown as black points.

Figure 4:
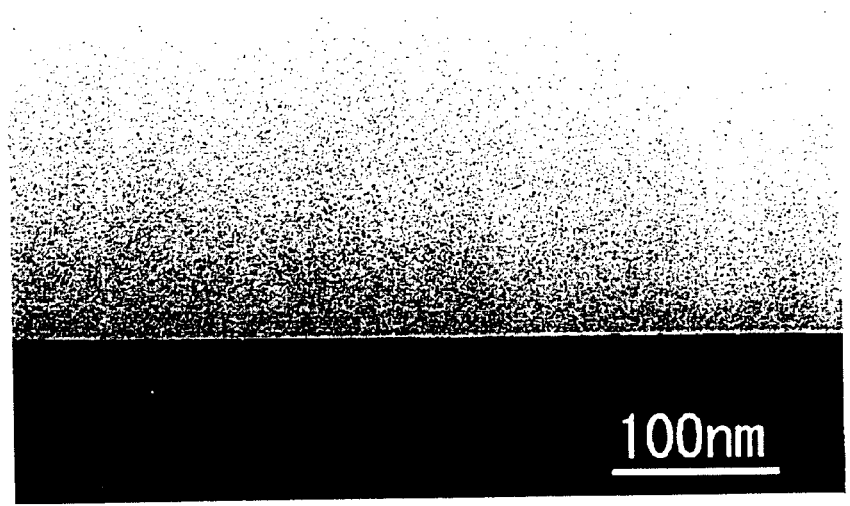
FIGS. 4(*a*) and (*b*) is a TEM photograph of a porous silica film formed in [Example 3].
Figure 4:
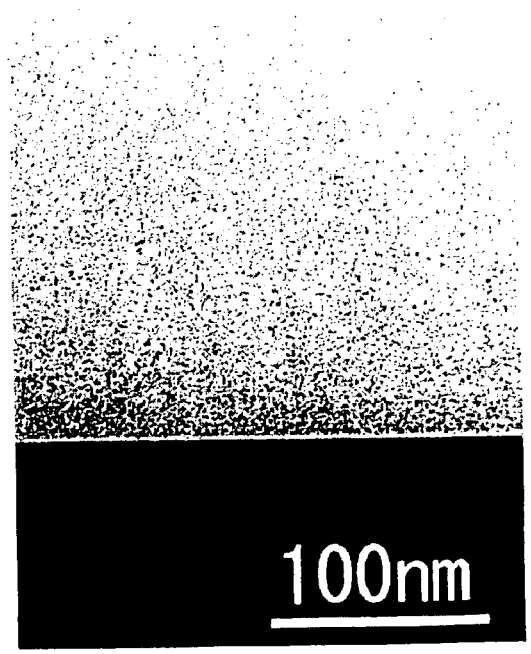

From the photograph of FIG. 4, it can be seen that the porous silica film obtained by [Example 3] has a pore structure in which pores having a diameter of 2 to 4 nm are uniformly dispersed while connecting in a worm-hole manner.

As apparent from the above explanation, according to the present invention, by adding a nonionic surfactant having the relatively large surface tension, a porous silica film excellent in mechanical strength is formed. In addition, a method of forming the film is simple via a wet process and thermal treatment.

In addition, by adding a dimethyldialkoxysilane compound in addition to the aforementioned surfactant, there is obtained a porous silica film which is of a worm-hole pore structure, but has strength not inferior to that of a periodic structure such as a hexagonal structure.

And, since the formed porous silica film maintains a low relative dielectric constant and a low refractive index and is excellent in mechanical strength, the film can be consistent with the practically required properties as an interlayer insulating film having a low relative dielectric constant in the semiconductor field or as a low refractive index film in the display field.

What is claimed is:

1. In a method for forming a porous silica film using a hydrolyzable alkoxysilane compound, water, an alcohol and a surfactant and acidic or alkaline catalyst, the method for forming a porous silica film, comprising:

acid hydrolysis or alkaline hydrolysis of the hydrolysable alkoxysilane compound, utilizing one or more kinds of nonionic surfactant(s) having a 0.1 weight % concentration according to the Du Nouy method expression and a surface tension of 45 mN/m or larger at 25° C. as the surfactant, coating a mixed solution obtained by mixing the nonionic surfactant, the alkoxysilane compound, water and the alcohol on a substrate, and decomposing or burning out the surfactant in the mixed solution, and wherein said hydrolyzable alkoxysilane compound is from 0.05 to 0.5 mole of a dimethyldialkoxysilane compound represented by $Si(CH_3)_2(OR)_2$ where a substituent R denotes a methyl group or an ethyl group.

2. The method for forming a porous silica film according to claim 1, wherein the nonionic surfactant comprises a polyoxyathylene-polyoxypropyl-ene condensate represented by $OH(CH_2CH_2O)x(CH(CH_3)CH_2O)y(CH_2CH_2O)xH$ where, x and y denote an integer satisfying $1 \leq x \leq 185$ and $5 \leq y \leq 70$, respectively.

3. The method for forming a porous silica film according to claim 2, wherein a mixing ratio in the mixed solution is 8 to 50 mole of the water, and 0.1 to 0.5 mole of the polyoxyethylene-polyoxypropylene condensate represented by $OH(CH_2CH_2O)x(CH(CH_3)CH_2O)y(CH_2CH_2O)xH$ relative to 1 mole of the alkoxysilane compound.

4. The method for forming a porous silica film according to any one of claims 1 to 3, wherein a mixed surfactant obtained by mixing a cationic into the nonionic surfactant is used as the surfactant.

5. The method for forming a porous silica film according to any one of claims 1 to 3, wherein a worm-hole porous structure can be observed by a sectional transmission electron microscope in a silica film formed by decomposition or burning out the surfactant.

6. The method for forming a porous silica film according to claim 4, wherein a worm-hole porous structure can be observed by a sectional transmission electron microscope in a silica film formed by decomposition or burning out the surfactant.

* * * * *

UNITED STATES PATENT AND TRADEMARK OFFICE
CERTIFICATE OF CORRECTION

PATENT NO. : 6,946,161 B2
DATED : September 20, 2005
INVENTOR(S) : Kazuhiro Yamada et al.

It is certified that error appears in the above-identified patent and that said Letters Patent is hereby corrected as shown below:

Column 8,
Line 43, delete "polyoxyathylene-polyoxypropyl-ene" and substitute
-- polyoxyethylene-polyoxypropylene --.
Line 45, delete "where," and substitute -- where --.
Line 54, after "cationic" insert -- surfactant --.

Signed and Sealed this

Twenty-fourth Day of January, 2006

JON W. DUDAS
*Director of the United States Patent and Trademark Office*